United States Patent [19]

Schneider et al.

[11] Patent Number: 4,727,882
[45] Date of Patent: Mar. 1, 1988

[54] METHOD FOR PROVIDING A MAGNETIC RESONANCE IMAGE FROM RESPIRATION-GATED IMAGE DATA

[75] Inventors: Siegfried Schneider, Erlangen; Axel Wirth, Nuremberg; Wilfried Schajor, Erlangen; Helmut Reichenberger, Eckental, all of Fed. Rep. of Germany

[73] Assignee: Siemens Aktiengesellschaft, Berlin and Munich, Fed. Rep. of Germany

[21] Appl. No.: 853,310

[22] Filed: Apr. 17, 1986

[30] Foreign Application Priority Data

Apr. 22, 1985 [DE] Fed. Rep. of Germany ....... 3514542

[51] Int. Cl.⁴ .................................................. A61B 5/05
[52] U.S. Cl. ...................................... 128/653; 128/721; 128/671; 324/309
[58] Field of Search ................ 128/653, 721, 722, 671; 324/309, 307

[56] References Cited

U.S. PATENT DOCUMENTS

| | | | |
|---|---|---|---|
| 4,506,222 | 3/1985 | Edelstein et al. | 324/309 |
| 4,545,384 | 10/1985 | Kawachi | 128/653 |
| 4,602,641 | 7/1986 | Feinberg | 128/653 |
| 4,614,195 | 9/1986 | Bottomley et al. | 128/653 |
| 4,616,182 | 10/1986 | Kramer et al. | 324/309 |

FOREIGN PATENT DOCUMENTS 0121312 10/1984 European Pat. Off. .
0132785 2/1985 European Pat. Off. .

OTHER PUBLICATIONS

Ehman et al, Magnetic Resonance Imaging with Respiratory Gating AJR 143: 1175–1182, Dec. 1984.

Primary Examiner—Edward M. Coven
Assistant Examiner—Ruth S. Smith
Attorney, Agent, or Firm—Mark H. Jay

[57] ABSTRACT

A method and a device for the composition of an MR image with respiration-controlled recording of the spin echoes. The phase coding gradient of an MR equipment is stepped as a function of a motion phase of the respiratory motion once per respiration cycle. With a constant phase coding gradient several scans, possibly EKG-triggered, are then recorded within the respiration cycle. The spin echo signals recorded for each scan are stored in a first memory. In a second memory, the amplitude of the respiratory motion at the respective scan moment is stored. Then a comparison of all stored amplitude of the respiratory motion with a reference value R is made. For the composition of the MR image only that scan per respiration cycle is used for which the respective amplitude of the respiratory motion fulfills a given criterion with respect to the reference value R.

12 Claims, 5 Drawing Figures

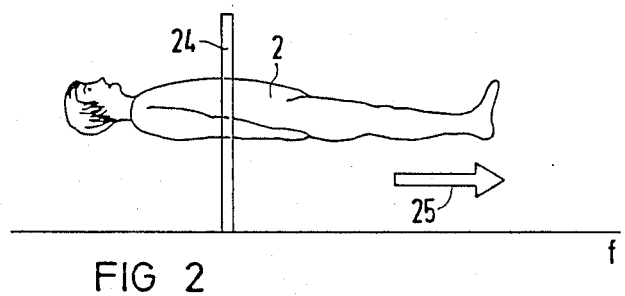
FIG 2
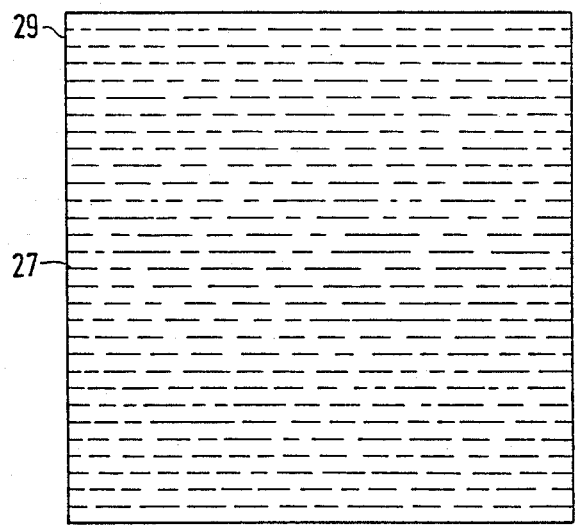
FIG 3
| 1 | 1 | 2 | 3 | 4 | 5 | 6 | 7 | 8 | 9 | 10 | 11 | 12 |
|---|---|---|---|---|---|---|---|---|---|---|---|---|
| 2 | 13 | | | | | | | | | | | 24 |
| 3 | 25 | | | | | | | | | | | 36 |
| 4 | 37 | | | | | | | | | | | 48 |
| 5 | 49 | | | | | | | | | | | 60 |
| 6 | 61 | | | | | | | | | | | 72 |
| 255 | | | | | | | | | | | | 3060 |
| 256 | 3061 | | | | | | | | | | | 3072 |
FIG 4

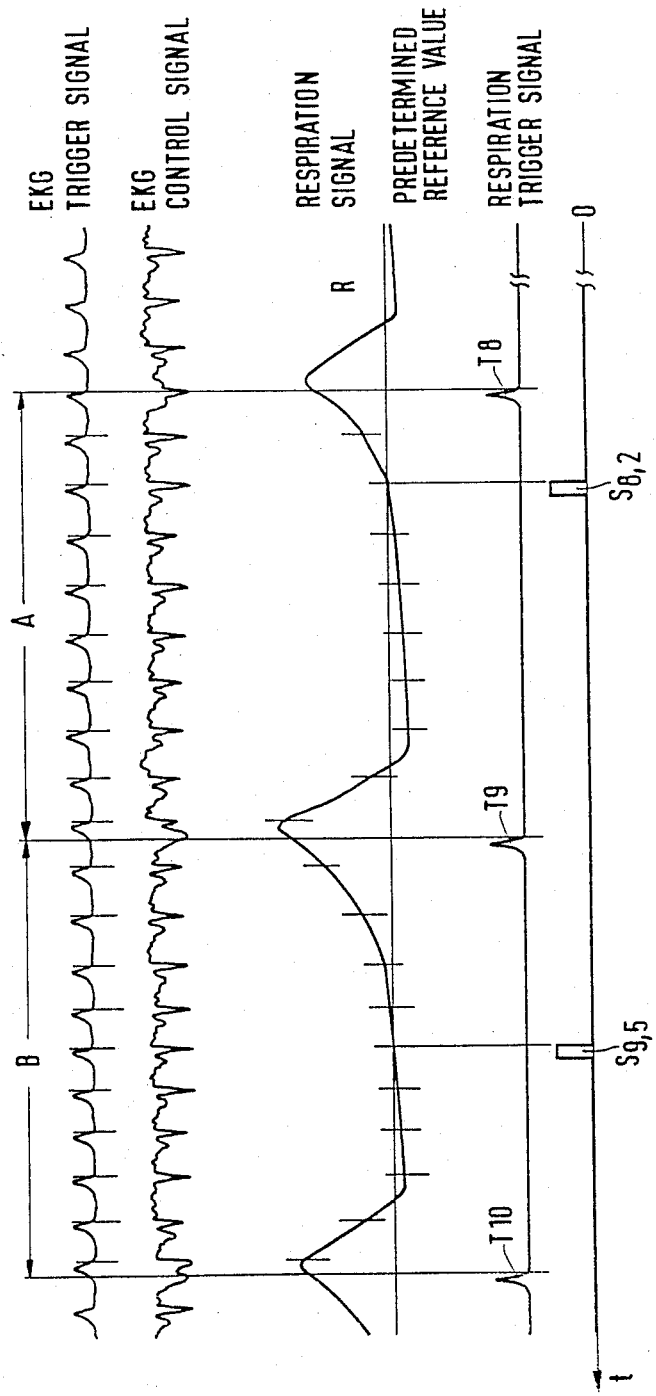

METHOD FOR PROVIDING A MAGNETIC RESONANCE IMAGE FROM RESPIRATION-GATED IMAGE DATA

BACKGROUND OF THE INVENTION

The invention relates to magnetic resonance ("MR") imaging, and more particularly relates to magnetic resonance imaging of body parts which are moved as a patient breathes.

It is known that nuclear (particularly hydrogen) spins of a test object can be deflected from a preferential direction which is established by a primary magnetic field. This deflection takes place by a radio-frequency excitation pulse, and only after a certain interval following the excitation pulse will these spins re-orient themselves in the preferential direction. During this interval the spins precess with a frequency which depends on the intensity of the magnetic primary field. The precession can be detected with an RF antenna and corresponding receiver circuits. If a first field gradient is superimposed on the homogeneous magnetic primary field, so that the magnetic field distribution varies spatially, locating of the spins in a first spatial direction, namely the gradient direction, is possible by measuring the respective measured frequency and correlating that frequency with the corresponding position.

It is also known that by a brief application of a second gradient field which is orthogonal to the first gradient, a location coding along a second space axis can be carried out before the signals in the first gradient are read, and that in this manner an MR image of a slice of a test object can be produced. The excitation in a slide of the test object is brought about by the fact that the magnetic primary field is influenced by an additional third field gradient perpendicular to the first and second gradients in such a way that only in this slice does an excitation of the nucleii take place. This is possible because the excitation occurs only with a frequency which is strictly correlated to the magnetic field in the desired slice. This method is described e.g. in German Offenlegungschrift No. 26 11 497.

Because the recording time required for MR imaging is relatively long, image disturbances result through the movement of the heart and lungs when these organs are imaged.

Therefore, heart- and respiration-gated image data acquisition has been used for MR scanning. A method of this kind is described in the publication "Magnetic Resonance Imaging with Respiratory Gating" by Richard L. Ehman et al, AJR: 143, Dec. 1984, pp. 1175-1182. There, a method is disclosed in which the radio-frequency signal is emitted at regular intervals; in accordance with these intervals, spin echoes are generated at regular intervals. However, not all spin echo signals are utilized in the image composition, but only those four or five spin echo signals which are obtained during an interval derived from the respiration curve. The selection of these four or five scans during the image data pickup has the disadvantage that variations in e.g. the depth of respiration cannot be taken into consideration. Therefore, there is a limitation to the taking of MR scans in the course of the image data pickup always in the same movement phase, as is desirable for a disturbance-free MR image.

It is an object of the present invention to develop a method and a device for MR imaging which will improve the image quality of normally-moving organs, such as the heart and lungs.

SUMMARY OF THE INVENTION

In accordance with the invention, the spin echoes for each of the scans are recorded, and only some of the data acquired is used. For each of the scans taken at a particular phase coding gradient, only the spin echoes for the best scan are utilized. This best scan is selected by comparing respiration-related information with reference information and selecting the scan for which the match is closest. The phase coding gradient is stepped at most once per respiration cycle, and an optimized image is constructed from all of the best scans taken while the phase coding gradient has stepped through its entire range.

Further according to the invention, a first memory is provided for storing the values of the measured spin echoes. A second memory is also provided for storing the amplitude of the respiratory motion at the respective scanning moment. A comparator in which the amplitudes of the respiratory motion at the scanning moments can be compared with a given reference value is also provided, as is a control unit which selects, for MR image composition, only those spin echo signals of a single scan per amplitude position of the phase coding gradient for which scan the correlated amplitude of the respiratory motion best fulfills a criterion settable in the comparator with respect to the reference value.

The invention has the advantage that for the MR image composition only those spin echoes are selected which belong to the "best scan" of a respiration cycle. The "best scan" is defined as that scan which best fulfills the given criterion with respect to the amplitude (or another suitable characteristic quantity as for example the slope) of the respiratory motion. This criterion may for example be the least distance of the amplitude of the respiration motion from the given reference value. The given reference value may thus also be a reference value for the slope of the respiratory motion. For example, a zero slope would mean a scan recorded closest to the minimum or to the maximum of the respiratory motion. Also several criteria may be linked, as for example by using, in addition to the least distance of the amplitude of the respiratory motion, the slope of the respiration curve at this point. Thus, only those scans which have been obtained within the exhalation phase or within the inhalation phase are utilized for the MR image.

Advantageously, the reference value is the value at which the standard deviation of a given number of central Fourier rows is smallest. With the aid of central Fourier rows, which have the greatest effect on the image quality, a statistically optimum reference value is determined. This reference value is then also used as a criterion for the scans of the other Fourier rows which are recorded respiration-controlled.

Because all scans with their respective respiration amplitudes are stored in the memories, it is possible afterwards to compose MR images of interest. It is possible, for example, to subtract MR images from different respiration phases, e.g. from the inhaled and exhaled states. Thus a differential image may be formed. Also, several images in different respiration phases can be produced. These separate images can be used e.g. for the dynamic representation of the respiration motion in the form of a film. It is further possible to simulate artifacts artificially to explore their effects on the image quality. Thus, for a number of Fourier rows, e.g. the 95th to 100th rows, a scan greatly differing from the reference value can be used for the image composition, and from this conclusions can then be drawn on how an artifact affects these Fourier rows at the time the MR picture is taken.

BRIEF DESCRIPTION OF THE DRAWINGS

Exemplary and non-limiting preferred embodiments of the invention are shown in the drawings, in which:

FIGS. 2 to 4 explain the operation of the apparatus of FIG. 1 and of the method according to the invention; and FIG. 5 shows a signal sequence with EKG and respiration trigger signals.

DETAILED DESCRIPTION OF PREFERRED EMBODIMENTS

Figure 1:
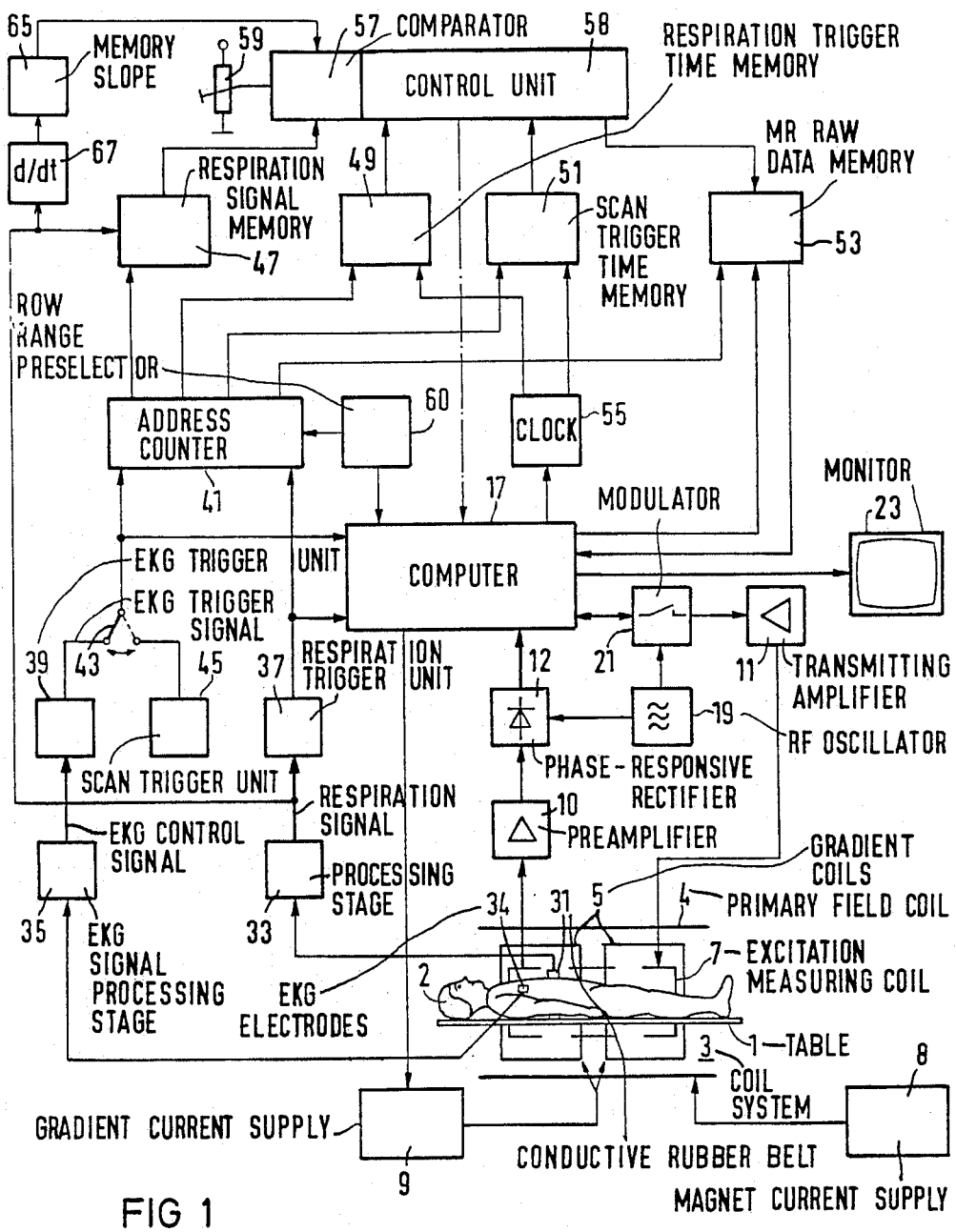
FIG. 1 shows a preferred embodiment of apparatus according to the invention.

In FIG. 1 is shown a table 1 on which a patient 2 lies of whom MR images are to be produced by means of nuclear magnetic resonance ("MR"). To this end there are provided a coil system 3 with a coil 4 for producing a homogeneous magnetic primary field, with gradient coils 5 for varying this magnetic primary field, and with an excitation and measuring coil 7. Coil 4 is connected to a magnet current supply 8, the gradient coils 5 are connected to a gradient current supply 9, the excitation and measuring coil 7 is connected to a preamplifier 10 and, via respective coupling elements, to a transmitting amplifier 11. Preamplifier 10 conducts the measuring signal of the spin echoes via a phase-responsive rectifier 12 to a process computer 17, which controls the entire measuring process. A radio-frequency oscillator 19 is used to generator excitation pulses. It is connectable to the transmitting amplifier 11 via a modulator 21. The reproduction of the MR images reconstructed from the measuring signals occur on a monitor 23. To produce an image of a slice of the patient 2 positioned in the coil system 3, first the nucleii in the desired slice are excited.

FIG. 2 shows that the respective excited slice 24 in patient 2 is determined by the location dependence of the flux density and hence of the nuclear resonance frequency. The field gradient for the magnetic primary field is indicated schematically in FIG. 2 and marked 25. The resonance frequency is designated by f. Excitation of the nucleii occurs only in the slice 24 of patient 2.

After this excitation, the coding of the spins takes place in the direction—referred to as the second space axis—of a brief gradient pulse along the second space axis. This gradient is called the phase coding gradient. Thereafter the nuclear resonance signal in the so-called reading gradient defining the first space dimension is scanned. This process is repeated e.g. with a phase coding gradient progressively altered from positive to negative. The nuclear resonance signals read at a certain phase coding gradient amplitude constitute a Fourier projection.

The measuring signals corresponding to the successive Fourier projections correspond to parallel Fourier rows of the matrix 29 shown in FIG. 3. In practice a complete matrix 29 may include, e.g., a total of 256 Fourier rows, the Fourier 0 row here indicated by reference numeral 27 (which row is associated to the phase coding gradient of amplitude 0) lying the center of the matrix 29 per FIG. 3. By two-dimensional Fourier transformation by rows and columns, an image of the examined slice can be calculated from the measuring signals of the individual Fourier rows.

For observation of the respiratory motion, a conductive rubber belt 13 is placed around patient 2 and used as a sensor, as shown in FIG. 1. The electric resistance variation of the rubber belt 31 corresponds to the girth variation of the abdomen and thus is a measure of the respiratory motion. Advantages of this sensor are the good coordination of the measuring signal with the diaphragm motion, the possibility of absolute measurement of the respiration amplitude, the use of non-magnetic materials, and the simple and practicable application. From the conductive rubber belt 31 a line leads to a processing stage 33, in which the resistance variations of the belt 31 are transformed into a respiration signal curve. EKG electrodes 34 are applied to the patient's chest in conventional manner, and lead to an EKG signal processing stage 35, at the output of which the EKG signal is delivered. From the output of the processing stage 33 a line leads to a respiration trigger unit 37. The EKG signal is passed from the output of the EKG signal processing stage 35 to an EKG trigger unit 39. In the trigger units 37 and 39 there are formed from the respiration and heart motion curves, respectively, control signals which are always delivered in the same motion phase of the motion cycle.

Each control signal from the output of the respiration trigger unit 37 is conducted to the process computer 17, whereupon the latter advances the phase coding gradient by one step per motion cycle. At an extremely high respiration frequency, as is found for instance in children, the phase coding gradient is advantageously advanced another step only after several breaths or after a given number of scans. It is in this case essential that there be at least one full breath between two control signals which are derived from the respiratory motion and which cause the stepping of the phase coding gradient. The triggering of this control signal need not be linked to respiration as such. Instead, successive control signals can be spaced apart by e.g. 20 seconds, within which interval a full breath of patient 2 is certain to have taken place. Thereafter, the next MR scan is carried out, and the next Fourier row of the matrix 29 is measured. Further this control signal is conducted from the output of the respiration trigger unit 37 to an address counter 41. The control signal which is present at the output of the EKG trigger unit 39 is also passed on to the address counter 41. For cases where non-EKG-triggered images are required, a switch 43 is provided, with which a scan trigger unit 45 can selectively be turned on instead of the EKG trigger unit 39. The scan trigger unit 45 then furnishes control signals with a presettable timing. Besides being conducted to the address counter 41, the control signals which are available at the output of the EKG trigger unit 39, or, depending on the position of switch 43, at the output of the scan trigger unit 45, are conducted also to the process computer 17. The latter triggers a scan after the arrival of a control signal.

From the address counter 41 signal lines lead to a respiration signal memory 47, to a respiration trigger time memory 49, to a scan trigger time memory 51, and to an MR raw data memory 53. By MR raw data are understood the spin echo signals measured in a scan and processed by the process computer 17. The respiration signal memory 47, the scan trigger time memory 51 and the MR raw data memory 53 are preferably designed like the memory 54 in FIG. 4 as will be explained later.

The address counter 41 addresses the memories 47, 51, and 53 in accordance with the arriving control signals from the respiration trigger unit 37 on the one hand and from the EKG trigger unit 39 or the scan trigger unit 45, on the other hand.

With every control signal pulse from the EKG trigger unit 39 or the scan trigger unit 45, the memory address moves up by 1, e.g. from 7 to 8. However, if a control signal pulse is delivered from the respiration trigger unit 37 to the address counter 41, the address counter 41 jumps to the smallest address of the next row, e.g. from 8 to 13, since one row consists of 12 columns. Thence, with the arrival of a control signal pulse from the EKG trigger unit 39, an address is again advanced by one step. This process will be explained once more in greater detail with reference to FIG. 4.

The memories 47, 51 and 53 thus addressed read the signal value present at their inputs into the respective memory position whenever a new memory address occurs. The signal value present at the input is in the case of the respiration signal memory 47 the amplitude of the respiratory motion. It is picked off at the output of the processing stage 33. In the case of the respiration trigger time memory 49, the signal value is the time status of a clock 55 which is started when the examination of patient 2 starts. The clock 55, therefore, is set in motion just before the first scan that occurs in the examination. The scan trigger time memory 51 is also connected to the clock 55. Stored in the time memories 49 and 51, therefore, is in each instance the time which has passed from the beginning of the examination to occurrence of the respiration trigger and EKG trigger signal or respectively the scan trigger signal. In the MR raw data memory 53, the spin echo signals processed by the process computer 17 are entered on the respective addressed memory position.

The output of the respiration signal memory 47 is connected to a comparator 57. The comparator 57 is in this example connected to a setting element 59 for input of a reference value R of the respiration amplitude. After completion of the examination of patient 2, the contents of the memory positions of each row of the respiration signal memory 47 are successively compared with the reference value R. Only that memory position of a Fourier row whose signal value (respiration amplitude) comes closest to the reference value R is applied—controlled via a control unit 58—to the address input of the MR raw data memory 53. The associated spin echo signals of the memory position thus determined are read into the process computer 17 and are used for the MR image composition. This process repeats row by row until the last Fourier row (here, row 256) has been processed.

Instead of the setting element 59 for input of the reference value R, this reference value R can be determined by a circuit (not shown) which determines the standard deviation of the respiration amplitudes. This is the value for which, for a given number of central Fourier rows, the mean deviation is smallest. For this method of determining the standard deviation there may be used for example the seven central Fourier rows, that is, rows 125 to 131, representing the zero amplitude phase coding gradient plus the three steps on either side of it.

The control unit 58 includes basicly two storage circuits. The address counter 41 selects the respiration amplitude one after another out of the respiration signal memory 47. The comparator 57 detects the difference between the reference value R and the selected respiration amplitude. The following procedure takes place for each Fourier row: In case that a detected difference is smaller than one detected before in this Fourier row, the new (smaller) difference is stored in one of the storage circuits. At the same time the other storage circuit is filled by the address counter 41 with the address belonging to the respiration amplitude related to the new difference. After the measuring of one Fourier row the stored value of the address counter 41 is given to the computer 17.

At the end of an examination, all respiration amplitudes that have occurred at the scan times are stored in the respiration signal memory 47. In the MR raw data memory 53 the respective spin echo signals are stored in the same memory positions. The reference value can be selected subsequently or even changed, to obtain MR images for different phases of the respiration motion. These MR images may contain different information.

In addition to the respiration signal memory 47, a similarly constructed further memory 65 may be provided, in which the slope d/dt of the respiration curve at the respective scan time is stored. The slope is provided by a differentiator 67. The comparator 57 then determines not only according to the criterion "least difference" between reference value R and respiration amplitude, but takes into consideration also whether for instance the sign of this slope is positive or negative. It is also possible to choose only the slope for the selection of those spin echo signals from which the MR image is to be composed. Thus, for example at slope zero and taking the amplitude into consideration, an MR image can be formed at the state of lowest inhalation and highest inhalation.

Appropriately the method is employed, not in all 256 Fourier rows, but preferentially in a central region which extends e.g. from the 108th to the 148th Fourier row. This central range is set in a row range preselector 60. This makes it possible to keep the size of the memories 47, 51, 53 relatively small.

It is advantageous to generate the respiration trigger signal at the change from inhalation to exhalation. Since when the control signal occurs at the output of the respiration trigger unit 37 the phase coding gradient is stepped, the spin echo signals with constant phase coding gradient are measured and stored during one breath. With the aid of the comparator 57, a suitable scan is selected from the raw data thus collected with reference to the respiration signals from each breath, that is, suitable spin echo signals are selected.

FIG. 4 illustrates a preferred configuration of the memory 54, which can be used as memory 47, 51, 53. Memory 54 has a matrix of memory positions, which has a number of rows equalling the number of Fourier rows, here 256 rows 1, 2, ... 256 (although more or fewer rows could be used). Each row contains e.g. 12 memory positions, in which—depending on which memory 47, 51, 53 it is—the respiration amplitude, the EKG or scan trigger time or respectively the raw data are stored.

Memory 49 consists of 256 rows and only one column. In this memory the respiration trigger time is stored.

Memory 54, (that is, each of the memories 47, 51 and 53) is addressed by the address counter 41. The address counter 41 addresses the memory positions 1, 2, 3 to 3072 in accordance with the applied control signals of the respiration trigger unit 37 as well as of the EKG trigger unit 39 or respectively the scan trigger unit 45. When an EKG trigger control pulse is applied, the memory position is increased by one within a row, e.g. in row 1 from 7 to 8. Since within a breathing cycle as a rule not more than nine to ten heart beats occur, the last two or three memory positions of each row, e.g. the memory positions 23 and 24 or row 2, are, as a rule, not addressed. This is why twelve memory positions per row are sufficient. But if there should be an especially high pulse rate, so that more than twelve heartbeats per respiration cycle occur, the scans per respiration cycle in excess of the number 12 will not be stored. The addressing system is set up so that each EKG signal (i.e. each heartbeat) advances the column of memory while keeping the row constant, and each respiration signal (i.e. each breath) advances to the first column of the next available row. In the normal case, therefore, addressing occurs for example at the beginning of the examination up to memory position 6. Then there is a respiration trigger control pulse, whereupon the address counter 41 switches to the first memory position of the next row, that is, memory position 13 of the second row. With each EKG trigger control pulse addressing of the memory position is advanced by 1 within this second row. Thus, assuming seven heart beats during the second respiration cycle successively the memory positions 13 to 19 are addressed. Then an additional respiration trigger control pulse occurs, and the address counter 41 switches to the first address of the next row, that is, to memory position 25. This process repeats until all 256 Fourier rows are recorded.

In FIG. 5 is represented the sequence of various signals according to the method here described as a function of time t. The time axis t runs from right to left.

In the second line the EKG control signal is shown, as measured at the output of the EKG signal processing stage 235. This signal is transformed into an EKG trigger signal, which is illustrated in the first line of FIG. 5. The short vertical strokes in the EKG trigger signal mark the times at which the individual scans are triggered. In the third diagram the time response of the respiration signal is shown, which is present at the output of the processing stage 33. In addition, the reference value R is entered. It can be seen that from this signal the respiration trigger unit 37 derives a signal which is recorded in the fourth diagram. The continuous vertical lines entered between the distances A and B mark the respective respiration trigger time. In the respiration trigger signal various trigger pulses T8, T9 and T10 are seen, which serve to trigger the process computer 17 on the one hand and the address counter 41 on the other. The time span A includes a total of nine heart beats, which are indicated at the respiration signal in the third diagram by short vertical strokes. In the time span B, however, there are ten heart beats. As has been explained above, each moment of such a heart beat corresponds to one scan. In A as well as in B the respiration signal is compared with the reference value R, namely at the individual scan moments, and the smallest distance is determined. In time span A the smallest distance occurs in the second heart beat, and in time span B the smallest distance is located in the fifth heart beat. The respective scans, marked $S_{8,2}$ and $S_{9,5}$ respectively, are utilized for image composition. The other scans within the time spans A and B are not taken into consideration.

By means of the respiration trigger time memory 49 and of the scan trigger time switch 51 it can be determined whether a scan trigger pulse has occurred simultaneously with the respiration trigger pulse. If this is the case, the scan is not triggered at the scan trigger moment, but only when the consequences from the occurrence of the respiration trigger signal are completed. Thus, for example, first the phase coding gradient must be advanced and the address counter 41 must jump to the next row. Thereby the scan is no longer triggered at the desired phase position of the heart, but later. The spin echo signals belonging to it are unusable and are not stored.

Those skilled in the art will understand that changes can be made in the preferred embodiments here described, and that these embodiments can be used for other purposes. Such changes and uses are within the scope of the invention, which is limited only by the claims which follow.

What is claimed is:

1. A method for composing an MR image from respiration-gated scan data, comprising performing the following steps on an MR unit which derives spin echoes from MR scans and which utilizes a phase coding gradient to identify locations from which such spin echos originate:
    changing the phase coding gradient in steps through its entire range at most once per respiration cycle;
    conducting a plurality of MR scans at each phase coding gradient;
    storing, for each scan, all the spin echos;
    storing, for each scan, information relating to respiratory motion;
    comparing said information with a reference value in accordance with a predetermined criterion;
    determining, for each phase coding gradient, a best scan in which said criterion is best satisfied; and
    using only spin echos from said best scans to compose the MR image.

2. The method of claim 1, wherein all scans are conducted in the same cardiac phase within the respiration cycle.

3. The method of claim 1, wherein the information includes respiratory motion amplitude and said criterion is a minimum difference from the reference value.

4. The method of claim 3, wherein said information includes the slope of the respiratory motion.

5. The method of claim 4, wherein said criterion includes a desired slope.

6. The method of claim 1, wherein said step of using comprises the step of deriving Fourier rows from successive Fourier projections of spin echoes, and using selected ones of said Fourier rows.

7. The method of claim 6, wherein said deriving step comprises the step of deriving 256 Fourier rows and said selected ones are between the 107th and 149th Fourier rows.

8. The method of claim 1, wherein said reference value is a minimum standard deviation of respiratory motion amplitude for a predetermined number of Fourier rows.

9. The method of claim 8, wherein said predetermined number is seven.

10. The method of claim 1, further including the step of storing for each scan a time at which the scan is carried out.

11. The method of claim 1, wherein the phase coding gradient is stepped as a function of respiratory motion phase.

12. The method of claim 1, wherein the phase coding gradient is stepped once per respiration cycle.

* * * * *